United States Patent [19]
Tada et al.

[11] Patent Number: 4,932,168
[45] Date of Patent: Jun. 12, 1990

[54] PROCESSING APPARATUS FOR SEMICONDUCTOR WAFERS

[75] Inventors: Masuo Tada, Yao; Takeki Hata, Kobe; Takaaki Fukumoto; Toshiaki Ohmori, both of Itami, all of Japan

[73] Assignees: Tsiyo Sanso Co., Ltd.; Mitsubishi Denki Kabushiki Kaisha, both of Japan

[21] Appl. No.: 177,784

[22] Filed: Apr. 5, 1988

[30] Foreign Application Priority Data

Jun. 23, 1987 [JP] Japan .................. 62-156061
Dec. 11, 1987 [JP] Japan .................. 62-313667

[51] Int. Cl.$^5$ .............................................. B24C 3/00
[52] U.S. Cl. .................................... 51/436; 51/320; 51/321; 51/322; 62/347; 134/7
[58] Field of Search ............... 51/16, 320, 321, 322, 51/410, 413, 427, 436; 62/347; 134/7, 13; 437/225

[56] References Cited

U.S. PATENT DOCUMENTS

| | | | |
|---|---|---|---|
| 2,699,403 | 1/1955 | Courts | 134/7 X |
| 3,162,019 | 12/1964 | Porter et al. | 62/347 X |
| 4,073,158 | 2/1978 | Guiller | 62/347 X |
| 4,389,820 | 6/1983 | Fong et al. | 51/410 |
| 4,402,193 | 9/1983 | McFee | 62/347 X |
| 4,655,847 | 4/1987 | Ichinoseki et al. | 51/410 X |
| 4,731,125 | 3/1988 | Carr | 134/7 |
| 4,806,171 | 2/1989 | Whitlock et al. | 134/7 |

FOREIGN PATENT DOCUMENTS

1397102 6/1975 United Kingdom .................. 51/320

Primary Examiner—Robert P. Olszewski
Attorney, Agent, or Firm—Leydig, Voit & Mayer

[57] ABSTRACT

A cleaning method and a gettering method for semiconductor wafers comprises blasting frozen particles at the surface of a semiconductor wafer. A processing apparatus for a semiconductor wafer comprises means for forming ultrafine frozen particles and means for blasting the frozen particles at the surface of a semiconductor wafer to perform either the gettering or the cleaning of the semiconductor wafer. In one form of the invention, the frozen particles are formed by spraying a mist of water into a chamber partially filled with liquid nitrogen, which freezes the mist to form ice particles. In another form of the invention, the frozen particles are formed by spraying a mist of water into a chamber containing cold nitrogen gas, which freezes the mist to form ice particles. In another form of the invention, the frozen particles are formed by heating water to form water vapor and introducing the water vapor into a freezing chamber containing a two-phase mixture of a coolant which freezes the vapor into ultrafine particles. The frozen particles are blasted at a semiconductor wafer through a blasting nozzle by a gas such as nitrogen gas. When the frozen particles are used for gettering, they may further include abrasive particles such as silica powder.

12 Claims, 6 Drawing Sheets

100μm

100μm

PROCESSING APPARATUS FOR SEMICONDUCTOR WAFERS

BACKGROUND OF THE INVENTION

This invention relates to a processing method and a processing apparatus for use in the manufacture of semiconductor devices. In particular, it relates to a processing method and a processing apparatus which can be used for the cleaning or gettering of a semiconductor wafer.

During the manufacture of semiconductor devices, it is necessary to clean semiconductor wafers. This cleaning is usually carried out using a cleaning apparatus of the type which is schematically illustrated in FIG. 1. As shown in this figure, a rotating brush B slides over the surface of a semiconductor wafer W in the direction of arrow T while being rotated about its axis in the direction shown by arrow R. At the same time, ultrapure water is sprayed at the surface of the wafter W by a jet nozzle N.

In this conventional method, it is difficult to remove ultrafine contaminant particles having a diameter on the order of 10 microns or less. In addition, due to the friction between the brush B and the wafer W, the brush B becomes worn and particles of the brush B adhere to the surface of the wafer W. Therefore, the brush B itself becomes a source of contamination. Furthermore, the friction between the brush B and the surface of the wafer W generates static electricity, which causes contaminants to adhere to the wafer surface and reduces the effectiveness of cleaning. There is thus a need for a cleaning method which can remove ultrafine contaminant particles without producing further contamination or static electricity.

Conventional gettering methods for semiconductor wafers suffer from similar problems. Extrinsic gettering of a semiconductor wafer can be performed by a wide variety of methods. One method is to blast particles of silica at the back side of a semiconductor wafer, thereby forming a damaged layer containing lattice defects. Another method is to produce a damaged layer using a quartz brush. However, in the blasting method using silica particles, the particles tend to adhere to the back side of the wafer and contaminate the wafer during subsequent manufacturing steps. In the method using a quartz brush, particles of the brush are worn by contact with the wafer. The worn brush particles also tend to adhere to the wafer and contaminate it.

SUMMARY OF THE INVENTION

Accordingly, it is an object of the present invention to provide a processing apparatus for a semiconductor wafer which can clean the surface of a semiconductor wafer without introducing additional contaminant particles.

It is another object of the present invention to provide a processing apparatus for a semiconductor wafer which can remove finer contaminant particles from the surface of a semiconductor wafer than can a conventional cleaning device.

It is yet another object of the present invention to provide a processing apparatus for a semiconductor wafer which can clean the surface of a semiconductor wafer without generating static electricity.

It is still another object of the present invention to provide a processing apparatus for a semiconductor wafer which can perform gettering by introducing lattice defects into the back side of a semiconductor wafer without leaving contaminants on the surface of the wafer and without generating static electricity.

It is a further object of the present invention to provide a processing apparatus for semiconductor wafers which can form ultrafine frozen particles having a uniform particle diameter of less than one micron.

It is another object of the present invention to provide a method for cleaning a semiconductor wafer which is more effective than a conventional cleaning method and does not produce static electricity.

It is yet another object of the present invention to provide a method for the gettering of a semiconductor wafer which does not leave contaminant particles on the surface of the semiconductor wafer and which does not generate static electricity.

In the present invention, cleaning or gettering of a semiconductor wafer is performed by blasting ultrafine frozen particles at the surface of the wafer. By employing frozen particles having a minute particle diameter, contaminant particles having a diameter of less than 10 microns can be easily cleaned off the surface of a wafer. As no brush is employed, there is no contamination of the wafer surface by particles which are worn off the brush, and the generation of static electricity is reduced.

A cleaning method and a gettering method for semiconductor wafers in accordance with the present invention both comprise blasting frozen particles at the surface of a semiconductor wafer.

A processing apparatus for semiconductor wafers in accordance with the present invention comprises freezing means for forming frozen particles and blasting means for blasting the frozen particles at the surface of a semiconductor wafer. The processing apparatus can be employed either as a cleaning device, or as a gettering device for introducing lattice defects into the back side of a semiconductor wafer.

There is no restriction on the material of which the frozen particles are formed, but in preferred embodiments, the frozen particles are ice particles formed from water. Ultrapure water containing carbon dioxide gas may also be employed to lower the specific resistance of the ultrapure water, whereby static electricity can be more effectively discharged.

When the frozen particles are used for gettering, they may also contain abrasive particles which serve as nuclei for the frozen particles. In a preferred embodiment, the abrasive particles are particles of silica powder.

Any type of device which can form ultrafine frozen particles can be employed as the freezing means. In one form of the present invention, the freezing means comprises a chamber which is partially filled with liquid nitrogen. A mist of water is sprayed into the top of the chamber towards the liquid nitrogen, which freezes the mist to form ice particles.

In another form of the present invention, the freezing means comprises a chamber containing cold nitrogen gas. A mist of water is sprayed into the top of the chamber, and as the mist travels downwards, it undergoes heat exchange with the cold nitrogen gas and forms ice particles.

In yet another form of the present invention, the freezing means comprises a vaporizing chamber in which water vapor is formed, and a freezing chamber in which the water vapor undergoes heat exchange with a coolant which freezes the water vapor into ice particles. In a preferred embodiment, the coolant is a twophase mixture of liquid nitrogen and nitrogen gas. The particle diameter of the ice particles can be controlled by controlling the rate at which the water vapor is introduced into the freezing chamber and the rate at which the water vapor is cooled by the coolant. This freezing means can form ultrafine ice particles having a uniform particle diameter of less than one micron.

In preferred embodiments, the blasting means comprises a high-pressure gas ejector-type blasting nozzle which blasts the frozen particles at a semiconductor wafer using nitrogen gas. The blasting nozzle is preferably inclined with respect to the surface of the semiconductor wafer so that the frozen particles will not rebound into the path of incident particles.

When the processing apparatus of the present invention is in the form of a cleaning device, it may be further equipped with heating means for heating the semiconductor wafer and the frozen particles as they travel between the blasting means and the surface of the semiconductor wafer. As a result of the heating, the frozen particles are partially melted and reduced in diameter, thereby increasing the ability of the frozen particles to remove minute contaminants. In one preferred embodiment, the heating means is in the form of a fan heater which blows warm air over the semiconductor wafer and the frozen particles. In another preferred embodiment, the heating means is a hot plate which is disposed below the semiconductor wafer and heats it to a prescribed temperature.

BRIEF DESCRIPTION OF THE DRAWINGS

In the drawings, the same reference numerals indicate the same or corresponding parts.

DESCRIPTION OF THE PREFERRED EMBODIMENTS

Figure 1:
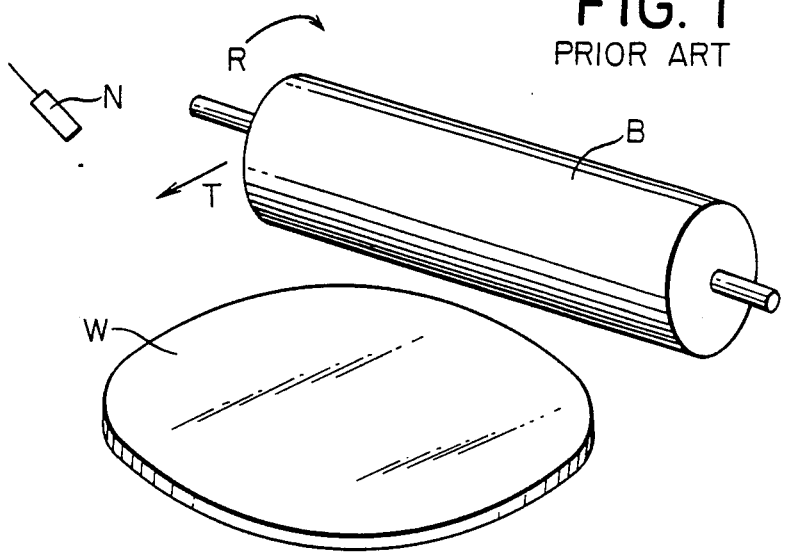
FIG. 1 is a schematic perspective view of a semiconductor wafer being cleaned by a rotating brush in accordance with a conventional cleaning method.
Figure 2:
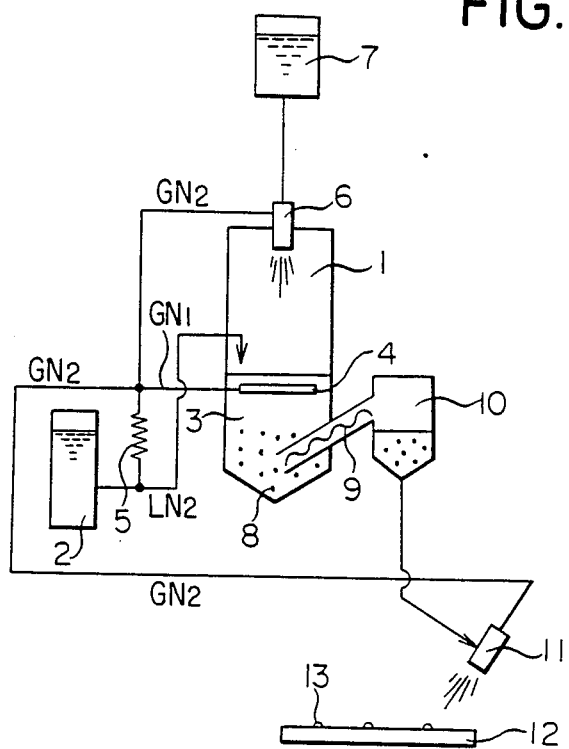
FIG. 2 is a schematic view of a first embodiment of a processing apparatus of the present invention in the form of a cleaning device for semiconductor wafers.

Hereinbelow, a number of preferred embodiments of a processing apparatus for semiconductor wafers in accordance with the present invention will be described while referring to the accompanying drawings. FIG. 2 is a schematic view of a first embodiment in the form of a device for cleaning semiconductor wafers. As shown in FIG. 2, a freezing chamber 1 is connected to a liquid nitrogen reservoir 2 which supplies liquid nitrogen 3 to the inside of the freezing chamber 1. The freezing chamber 1 measures 400 mm×400 mm in cross section and has a height of 1200 mm. The liquid nitrogen 3 partially fills the freezing chamber 1 to a height of 500 mm. A diffuser 4 which is submerged in the liquid nitrogen 3 is connected to the liquid nitrogen reservoir 2 via a heat exchanger 5. Liquid nitrogen which passes through the heat exchanger 5 vaporizes to form nitrogen gas and is blow out of the diffuser 4 at a rate of 300 liters per square mm per minute to form waves having a height of a few mm in the surface of the liquid nitrogen 3. An atomizer 6 is mounted in the top of the freezing chamber 1. Pure water from a pure water reservoir 7 is supplied to the atomizer 6 under a gauge pressure of 2.0 kg per square cm at a rate of 0.1 liters per minute, together with nitrogen gas. The nitrogen gas is formed from liquid nitrogen in the heat exchanger 5, under gauge pressure of 2.0 kg per square cm at a rate of 8 nonoliters (nl) per minute. The pure water from the reservoir 7 is sprayed from the atomizer 6 towards the liquid nitrogen 3 in the form of a mist. Upon entering the liquid nitrogen 3, the mist of pure water immediately freezes and becomes ultrafine ice particles 8. Under the atomizing conditions, the ice particles 8 have a particle diameter on the order of 20 microns. The diameter of the ice particles 8 can be varied by changing the atomizing conditions or the length of time spent in the liquid nitrogen 3.

The bottom of the freezing chamber 1 is connected to a hopper 10 by a screw feeder 9, which transports the ice particles 8 from the freezing chamber 1 into the hopper 10. The hopper 10 is also connected to a high-pressure gas ejector-type blasting nozzle 11. The ice particles 8 within the hopper 10 are supplied to the blasting nozzle 11 and are blasted from the nozzle 11 at a rate of 0.3 liters per minute by high-pressure nitrogen gas. The nitrogen gas is supplied to the nozzle 11 from the liquid nitrogen reservoir 2 via the heat exchanger 5 under a gauge pressure of 5 kg per square cm at a rate of 1 nm$^3$ per minute. The blasting nozzle 11 is disposed above the surface of a semiconductor wafer 12 so that the blast of ice particles 8 from the nozzle 11 will strike the top surface of the wafer 12.

There is no restriction on the position of the blasting nozzle 11, but preferably it is disposed so that the fine ice particles 8 will strike the surface of the semiconductor wafer 12 at an angle of 30°–80° with the respect to the plane of the wafer 12 to increase the impact of the ice particles 8 against the wafer 12. If the blasting nozzle 11 is perpendicularly disposed with respect to the surface of the wafer 12, the fine ice particles 8 and the nitrogen gas which are ejected from the blasting nozzle 11 will rebound into the path of incident ice particles 8 and decrease their energy. However, if the nozzle 11 is inclined with respect to the wafer 12 as shown in FIG. 2, ice particles 8 and nitrogen gas which rebound from the surface of the wafer 12 will not interfere with other incident ice particles 8. Thereby the energy of the incident ice particles 8 can be maximized, thereby increasing the cleaning effect of the ice particles 8.

Fine contaminant particles 13 which adhere to the top surface of the semiconductor wafer 12 are blown off by the impact of the fine ice particles 8 which are ejected from the blasting nozzle 11. At the same time, the ice particles 8 partially melt to form water which functions as a solvent for contaminants on the surface of the wafer 12. The water also discharges static electricity on the surface of the wafer 12 and helps prevent the generation of dust.

Therefore, in a cleaning device of the present invention, a cleaning brush is not employed, so the semiconductor wafer 12 is not contaminated by particles which are worn off the brush, and the surface of the wafer 12 can be cleaned more effectively. Furthermore, no static electricity is generated by friction between the wafer 12 and a cleaning brush.

In this embodiment, the ice particles 8 are made from pure water, but it is also possible to form them from ultrapure water containing carbon dioxide gas. By including carbon dioxide gas in the ultrapure water, the specific resistance of the ice particles 8 can be reduced to 1 megohm-cm or less. When the ice melts, it forms water with a very low specific resistance, which is effective in preventing the generation of static electricity. Furthermore, water containing carbon dioxide gas is effective in killing microorganisms.

Figure 3:
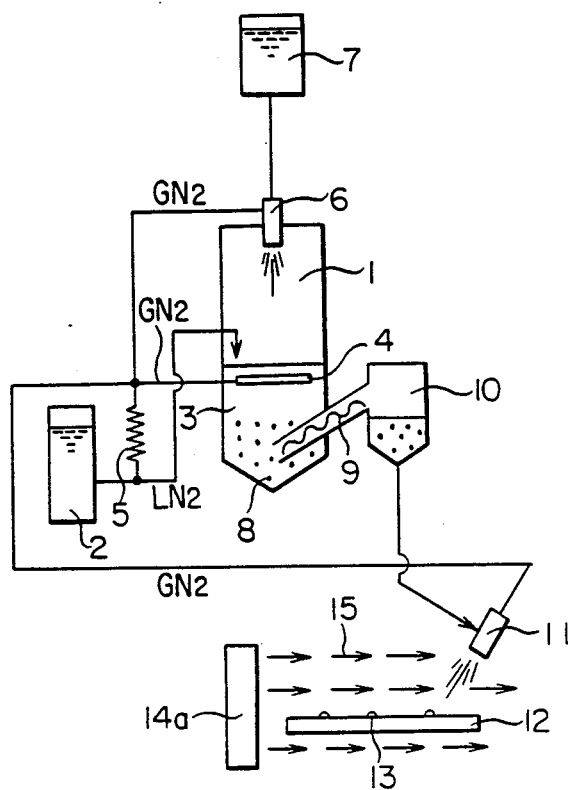
FIG. 3 is a schematic view of a second embodiment of the present invention in the form of a cleaning device for semiconductor wafers.

FIG. 3 schematically illustrates a second embodiment of the present invention which is also in the form of a cleaning device for semiconductor wafers. This embodiment differs from the embodiment of FIG. 2 only in that it is further equipped with a fan heater 14a which is disposed to blow clean, warm air 15 over a semiconductor wafer 12 and past ice particles 8 as they travel between a blasting nozzle 11 and the surface of the wafer 12. The warm air 15 is at a temperature of approximately 5°-80° C. The purpose of the warm air 15 is to partially melt the ice particles 8 as they travel towards the surface of the wafer 12 and reduce their diameter. As a result of the melting, the particle diameter of the ice particles 8 can be reduced to 1/10 to 1/100 of the diameter of the particles upon leaving the blasting nozzle 11. By controlling the speed and the temperature of the warm air 15, the particle diameter can be reduced to a desired level. By suitably reducing the particle diameter of the ice particles 8, it is possible to remove ultrafine contaminant particles 13 having a diameter of less than a micron from the surface of the wafer 12. The operation of this embodiment is otherwise the same as that of the embodiment of FIG. 2 and the same benefits are obtained.

Figure 4:
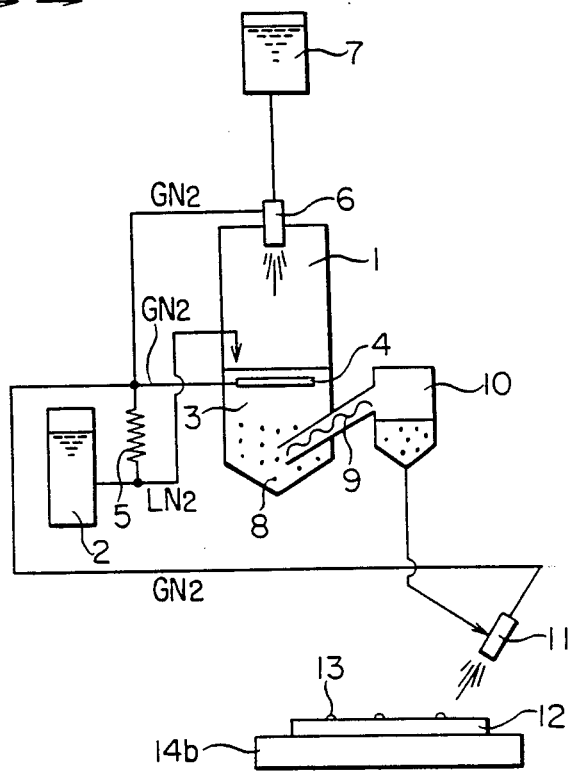
FIG. 4 is a schematic view of a third embodiment of the present invention in the form of a cleaning device for semiconductor wafers.

FIG. 4 is a schematic view of a third embodiment of the present invention which differs from the embodiment of FIG. 3 only in that the fan heater 14a is replaced by a hot plate 14b which is disposed beneath a semiconductor wafer 12 to be cleaned. By means of the hot plate 14b, the wafer temperature is controlled to fall between room temperature and 200° C. By controlling the wafer temperature, the diameter of the ice particles 8 which strike the surface of the wafer 12 can be controlled, and by suitably reducing the diameter of the ice particles 8, ultrafine contaminant particles 13 can be cleaned off the wafer 12.

In the embodiments of FIGS. 3 and 4, the ice particles 8 may be formed from ultrapure water containing carbon dioxide gas to lower the specific resistance of the ice particles 8. Such ice particles 8 provide the same advantages as were described with respect to the embodiment of FIG. 2.

Figure 5:
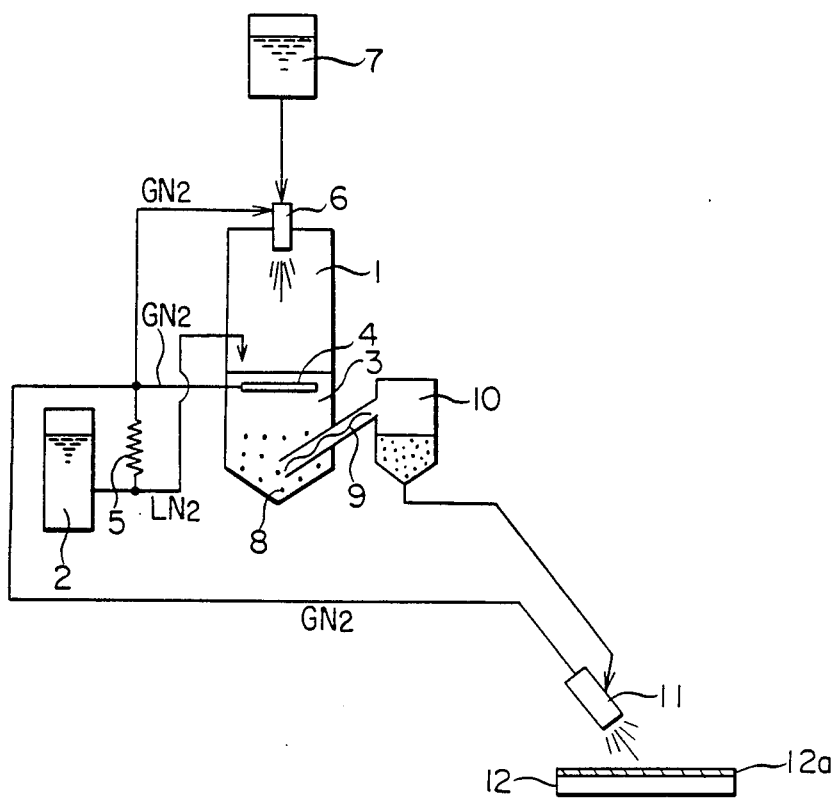
FIG. 5 is a schematic view of a fourth embodiment of the present invention in the form of a gettering device for semiconductor wafers.

FIG. 5 schematically illustrates a fourth embodiment of the present invention which is in the form of a device for performing extrinsic gettering of a semiconductor wafer 12. The structure of this embodiment differs from that of the embodiment of FIG. 2 only in that a blasting nozzle 11 is disposed to eject fine ice particles 8 at the back side of a semiconductor wafer 12 instead of at the front surface. As in the previous embodiments, the blasting nozzle 11 is preferably inclined at an angle of 30°-80° with respect to the surface of the wafer 12. The particle diameter of the ice particles 8 can be easily controlled by controlling the atomizing conditions. For example, if pure water is supplied to the atomizer at a gauge pressure of 2.0 kg per square cm at a rate of 0.1 liters per minute together with nitrogen gas under a gauge pressure of 1.2 kg per square cm at a rate of 4.5 nl per minute, ice particles 8 having a diameter on the order of 70-80 microns are formed. When such ice particles 8 are ejected from the blasting nozzle 11 at the back side of the wafer 12 and impact the wafer 12, a damaged layer 12a containing lattice defects is formed in the back side of the wafer 12 and gettering is effectively carried out.

In this embodiment, as ice particles 8 are used instead of silica particles or a quartz brush to introduce lattice defects into the back side of a wafer 12, no contaminant particles which can affect subsequent manufacturing processes are introduced during gettering.

As in the previous embodiments, it is advantageous to form the ice particles 8 from ultrapure water which contains carbon dioxide gas and which has a specific resistance of at most 1 megohm-cm.

Figure 6:
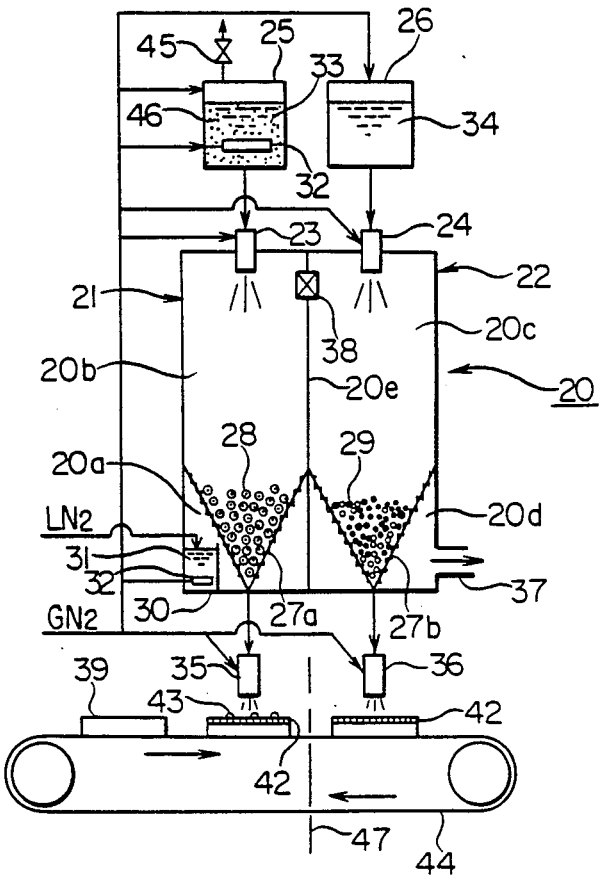
FIG. 6 is a schematic view of a fifth embodiment of the present invention in the form of a device for performing both the gettering and cleaning of semiconductor wafers.

Each of the previous embodiments of the present invention is in the form of a device for performing either cleaning or gettering of a semiconductor wafer. FIG. 6 is a schematic view of a fifth embodiment of the present invention which is in the form of a device for simultaneously performing both operations. As shown in this figure, a freezing chamber 20 is divided by a vertical partition 20e into a first ice machine 21 and a second ice machine 22, both measuring 400 mm×400 mm in cross section and having a height of 1500 mm. The first ice machine 21 is further divided into two chambers 20a and 20b by a mesh 27a which slopes downwards from the walls of chamber 20a towards the center thereof. The first ice machine 21 forms ice particles 28 which have abrasive particles 33 as nuclei. These ice particles 28 will be referred to as ice-coated blasting particles.

The second ice machine 22 is likewise divided into two chambers 20c and 20d by another mesh 27b. Chamber 20d has an exhaust port 37 which extends to the outside of the freezing chamber 20. The second ice machine 22 forms ultrapure ice particles 29 from ultrapure water 34.

An air filter 38 is mounted in the upper portion of the partition 20e to enable gas to flow from the first ice machine 21 into the second ice machine 22. A first atomizer 23 is mounted in the top of chamber 20b of the first ice machine 21, and a second atomizer 24 is mounted in the top of chamber 20c of the second ice machine 22. The inlet port of the first atomizer 23 is connected to a pressurized vessel 25 which contains a pressurized mixture of water 46 and abrasive particles 33 such as silica powder. The inlet of the second atomizer 24 is connected to a pressurized vessel 26 which contains pressurized ultrapure water 34. The insides of the pressurized vessels 25 and 26 are pressurized by nitrogen gas which is introduced from an unillustrated source. Pressurized vessel 25 for the mixture of water and abrasive particles contains a diffuser 32 below the surface of the mixture. Nitrogen gas is introduced into the diffuser 32 from the nitrogen gas source. A blow-off valve 45 which communicates between the inside and the outside of the pressurized vessel 25 is secured to the top thereof above the surface level of the mixture.

The bottom portion of chamber 20b of the first ice machine 21, where the ice-coated blasting particles 28 accumulate, is connected to a first blasting nozzle 35 to supply ice-coated blasting particles 28 thereto. The bottom portion of chamber 20c of the second ice machine 22 is connected to a second blasting nozzle 36 to supply ultrapure ice particles 29 thereto. The blasting nozzles 35 and 36 are high-pressure gas ejector-type nozzles which are connected to the unillustrated source of nitrogen gas. A conveyor belt 44 for conveying semiconductor wafers 39 and positioning them below the blasting nozzles 35 and 36 is disposed beneath the freezing chamber 20. Although the two blasting nozzles 35 and 36 are vertically disposed in the illustration, preferably, they are inclined at an angle of 30°–80° with respect to the plane of the semiconductor wafers 39, for the reasons which were explained with respect to the preceding embodiments.

Chamber 20a of the first ice machine 21 houses a liquid nitrogen reservoir 30. The reservoir 30 is filled with liquid nitrogen 31 which is introduced from an unillustrated source. A diffuser 32 is submerged in the liquid nitrogen 31 and is connected to the unillustrated source of nitrogen gas.

The operation of this embodiment is as follows. Nitrogen gas is bubbled from the diffuser 32 into the liquid nitrogen 31 of the liquid nitrogen reservoir 30. As a result, a portion of the liquid nitrogen 31 is vaporized to form cold nitrogen gas. The cold nitrogen gas passes through the mesh 27a and enters chamber 20b of the first ice machine 21.

At the same time, in pressurized vessel 25, the mixture of water 46 and abrasive particles 33 is constantly stirred and the abrasive particles are kept suspended by nitrogen gas which is bubbled from the diffuser 32. The rate of bubbling of nitrogen gas is controlled by the blow-off valve 34. The aqueous mixture is supplied to the first atomizer 23 under a gauge pressure of, for example, 4.0 kg per square cm at a rate of 0.2 liters per minute. At the same time, nitrogen gas is supplied to the first atomizer 23 under a gauge pressure of 4.0 kg per square cm at a rate of 20 liters per minute. As a result, the mixture of water 46 and abrasive particles 33 is sprayed from the first atomizer 23 into chamber 20b as a fine mist. The mist undergoes heat exchange with the cold nitrogen gas which was generated in chamber 20a and freezes to become ice-coated blasting particles 28, which accumulate atop the mesh 27a.

Figure 7:
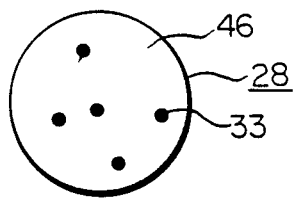
FIG. 7 is a schematic view of an ice-coated blasting particle which is formed by the embodiment of FIG. 6.

Under these atomizing conditions, the resulting ice-coated blasting particles 28 have a particle diameter of approximately 70 microns. The number of abrasive particles 33 in each of the ice-coated blasting particles 28 depends on the size of the abrasive particles 33, but generally several abrasive particles 33 are contained therein. The amount of abrasive particles 33 in each ice-coated blasting particle 28 can be adjusted by varying the ratio of water 46 to abrasive particles 33 in the pressurized vessel 25. Furthermore, the particle diameter of the ice-coated blasting particles 28 can be controlled by controlling the rate at which aqueous mixture and nitrogen gas are supplied to the first atomizer 23. FIG. 7 schematically illustrates an ice-coated blasting particle 28 which is formed by the first ice machine 21.

The cold nitrogen gas which was used to form the ice-coated blasting particles 28 then passes through the air filter 38 into chamber 20c of the second ice machine 22. At the same time, ultrapure water 34 from pressurized vessel 26 is supplied to the second atomizer 24 under a gauge pressure of 4.0 kg per square cm at a rate of 0.1 liters per minute. Nitrogen gas is also supplied thereto under a gauge pressure of 4.0 kg per square cm at a rate of 40 liters per minute, and a mist of ultrapure water is sprayed from the second atomizer 24 into chamber 20c. The mist of ultrapure water undergoes heat exchange with the cold nitrogen gas and freezes into ultrapure ice particles 29, which accumulate atop the mesh 27b at the bottom of chamber 20c. The cold nitrogen gas which was used to form the particles 29 passes through the mesh 27b and is removed from chamber 20d via the exhaust port 37. Under the given spraying conditions, the ultrapure ice particles 29 which are formed have a particle diameter of approximately 40 microns. The particle diameter can be adjusted by varying the rate at which the ultrapure water 34 and nitrogen gas are supplied to the second atomizer 24.

The gettering and cleaning of a semiconductor wafer by the illustrated embodiment is as follows. A number of semiconductor wafers 39 are disposed on the conveyor belt 44 with their back sides facing upwards. The conveyor belt 44 transports each wafer 39 to a prescribed position in the vicinity of the first blasting nozzle 35, and ice-coated blasting particles 28 which are accumulated on mesh 27a are blasted from the first blasting nozzle 35 at the back side of the wafer 39 by nitrogen gas. Nitrogen gas is supplied to the first blasting nozzle 35 under a gauge pressure of 5 kg per square cm at a rate of 1 cubic meter per minute, and the ice-coated blasting particles 28 are ejected at a rate of 0.3 liters per minute. The particles 28 impact the back side of the wafer 39, gettering by producing a damaged layer 42 containing lattice defects.

After gettering a small amount of fragments 43 of the abrasive particles 33 tend to adhere to the back side of the semiconductor wafer 39. Accordingly, the semiconductor wafer 39 which was just subjected to gettering is moved by the conveyor belt 44 in the direction of the arrows to a prescribed position in the vicinity of the second blasting nozzle 36. In this position, ultrapure ice particles 29 are blasted at the back side of the wafer 39 by the second blasting nozzle 36, and all contaminants are cleaned off the wafer 39.

By providing an adequate separation between the first blasting nozzle 35 and the second blasting nozzle 36, or by providing a partition or air curtain 47 between the two nozzles, it is possible to simultaneously getter and clean two different semiconductor wafers 39 without the ice-coated blasting particles 28 from the first blasting nozzle 35 falling on a wafer 39 which is being cleaned by the second blasting nozzle 36.

The ice-coated blasting particles 28 which are employed in this embodiment to introduce lattice defects are superior to abrasive particles alone. While they have the same impact force as abrasive particles, the coating of ice on the ice-coated abrasive particles prevents them from burrowing into the surface of the wafer 39, so that subsequent cleaning of the wafer surface is easier. Furthermore, when the ice-coated blasting particles 28 strike the surface of a wafer 39, the ice coating shatters, and the resulting ice fragments help to clean abrasive particles 33 off the surface of the wafer 39. When the ice fragments melt, they act as a solvent for contaminants and help to suppress the formation of dust. The ultrapure ice particles 29 which are used to clean the surface of the wafer 39 provide the same effects as in the previous embodiments.

In this embodiment, instead of using ultrapure water 34 and water 46 to form the ultrapure ice particles 28 and the ice-coated blasting particles 29, respectively, ultrapure water which contains carbon dioxide gas and which has a specific resistance of at most 1 megohm-cm can be used with the same benefits as in the previous embodiments.

In the embodiments of FIGS. 2-5, ice particles are formed by spraying a mist of water onto liquid nitrogen. With this method of forming ice particles, there is a practical limit to the minimum particle diameter which can be achieved, and it is extremely difficult to reduce the particle diameter to even 20 microns. However, in order to remove ultrafine contaminant particles having a particle diameter on the submicron level, to remove burrs, and to process delicate items, i.e., items requiring precision working, or items having minute surface irregularities, it is necessary to employ particles having a diameter of at most several microns.

Furthermore, frozen particles which are formed in the manner shown in FIGS. 2-5 have a wide variation in particle diameter, resulting in a variation in the effectiveness of cleaning and gettering. In particular, when processing delicate items, there is a danger of damaging the surface being treated with particles having a large diameter.

Figure 8:
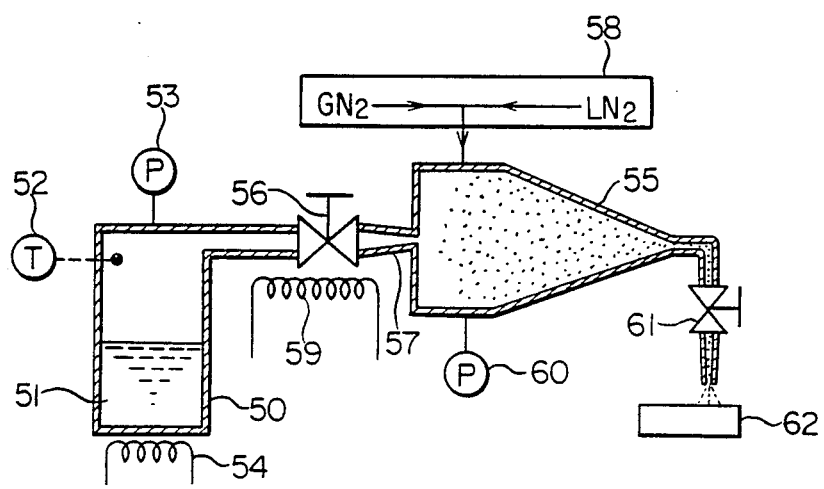
FIG. 8 is a schematic view of a sixth embodiment of the present invention in the form of a device for cleaning a semiconductor wafer.

FIG. 8 illustrates a sixth embodiment of the present invention in the form of a cleaning device for semiconductor wafers which is capable of forming ultrafine ice particles having a highly uniform particle diameter of less than one micron. As shown in this figure, a sealed vaporizing chamber 50 is partially filled with a liquid to be formed into froze particles, which in this case is water 51. A heater 54 for evaporating the water 51 is disposed beneath the bottom of the vaporizing chamber 50. A thermometer 52 and a pressure gauge 53 for measuring the temperature and pressure, respectively, of water vapor within the vaporizing chamber 50 are mounted on the outside of the vaporizing chamber 50 with the sensing portions thereof exposed to the interior of the vaporizing chamber 50 above the surface level of the water 51.

The amount of saturated water vapor in the vaporizing chamber 50 depends on the temperature and pressure within the vaporizing chamber 50. In this embodiment, the amount of saturated water vapor is adjusted by varying the output of the heater 54 in accordance with the temperature and the pressure which are respectively measured by the thermometer 52 and the pressure gauge 53.

The upper portion of the vaporizing chamber 50 is connected to a freezing chamber 55 via a flow control valve 56. The freezing chamber 55 has roughly the shape of a truncated cone. Water vapor from the vaporizing chamber 50 which passes through the flow control valve 56 enters the freezing chamber 55 via a reducer 57 which is formed on one end thereof and which is connected to the outlet side of the flow control valve 56. The inside diameter of the reducer 57 progressively decreases from the end which is connected to the flow control valve 56 towards the end which is connected to the freezing chamber 55 to maintain a pressure differential between the vaporizing chamber 50 and the freezing chamber 55. A heater 59 is disposed in the vicinity of the flow control valve 56 and the reducer 57 to heat the water vapor passing therethrough. The opposite end of the freezing chamber 55 is connected to a blasting nozzle 61. A two-phase coolant mixture comprising liquid nitrogen and nitrogen gas is supplied to the inside of the freezing chamber 55 from a coolant supply 58. The internal pressure of the freezing chamber 55 is monitored by a pressure gauge 60 which is connected to the freezing chamber 55.

The flow control valve 56 and the heater 59 together constitute means for controlling the pressure of the water vapor which enters the freezing chamber 55. The pressure of the water vapor can be controlled either by adjusting the flow rate of the water vapor by varying the opening of the flow control valve 56, or by adjusting the temperature of the water vapor by means of the heater 59. The heater 59 also prevents the water vapor from condensing as it passes through the flow control valve 56 and the reducer 57. As both the flow control valve 56 and the heater 59 have the ability to control the vapor pressure, it is possible to omit either one of the two if necessary.

A semiconductor wafer 62 is disposed in the vicinity of the blasting nozzle 61 so that ultrafine ice particles which are ejected from the nozzle 61 will strike the surface of the wafer 62. Although the nozzle 61 is shown as being perpendicular to the wafer 62, as in the previous embodiments, it is advantageous for the blasting nozzle 61 to be inclined at an angle of 30°-70° with respect to the surface of the wafer 62.

The operation of this embodiment is as follows. With the flow control valve 56 initially closed, the water 51 is heated by the heater 54 to produce water vapor. While the heating is being performed, the temperature and pressure within the vaporizing chamber 50 are monitored by means of the thermometer 52 and the pressure gauge 53. When the vapor pressure within the vaporizing chamber 50 reaches a suitable value, as indicated by the values measured by the thermometer 52 and the pressure gauge 53, the flow control valve 56 is opened. At the same time, the heater 59 is turned on to heat the flow control valve 56 and the reducer 57 to a suitable temperature. When the flow control valve 56 is opened, the water vapor which was formed within the vaporizing chamber 50 enters the freezing chamber 55 through the flow control valve 56 and the reducer 57. Simultaneously, the coolant mixture of liquid nitrogen and nitrogen gas is introduced into the freezing chamber 55 from the coolant supply 58. The water vapor which enters the freezing chamber 55 is rapidly cooled by the coolant mixture and becomes ultrafine ice particles. The particle diameter of the resulting ice particles depends upon the cooling rate of the water vapor within the freezing chamber 55. The higher the cooling rate, the smaller is the particle diameter. By using a high rate of cooling, it is therefore possible to obtain ultrafine ice particles.

Figure 9:
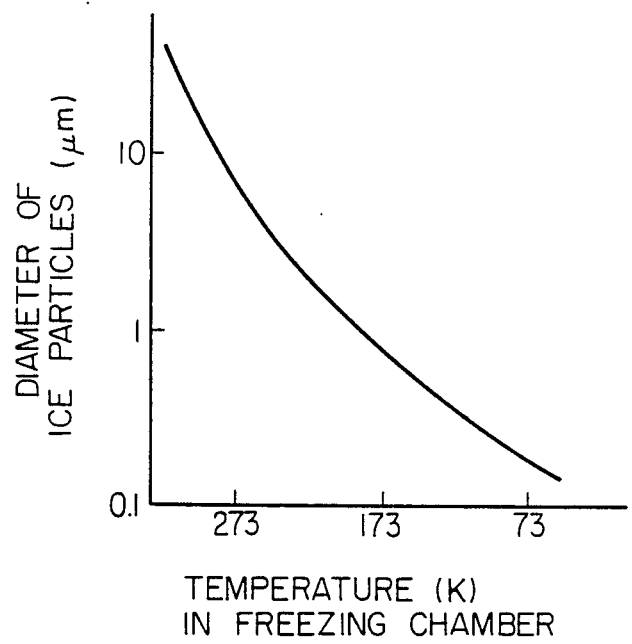
FIG. 9 is a graph of the relationship between the diameter of frozen particles formed by the embodiment of FIG. 8 and the temperature within the freezing chamber.

The present inventors carried out experiments using the apparatus of FIG. 8 with a coolant mixture of liquid nitrogen and nitrogen gas to investigate the relationship between the particle diameter of ice particles formed in the freezing chamber 55 and the cooling rate. The results are shown in FIG. 9, which is a graph of the particle diameter as a function of cooling temperature. It can be seen that with other conditions being constant, the particle diameter decreases logarithmically with decreasing temperature. By controlling the cooling speed, the particle diameter of the ice particles can be easily varied from 0.1–10 microns. The particle diameter is also a function of the velocity, the flow rate, and the pressure of the water vapor as it enters the freezing chamber 55. Therefore, it is possible to control the particle diameter by suitably adjusting one or more of the opening of the flow control valve 56, the output of the heater 54 for the vaporizing chamber 50, and the output of the heater 59 for the flow control valve 56.

The ultrafine ice particles which are formed in the freezing chamber 55 are ejected from the blasting nozzle 61 together with the coolant mixture at the surface of a semiconductor wafer 62, thereby cleaning the surface of the wafer 62 in the same manner as in the previous embodiments. The rate at which the ultrafine ice particles are blasted at the wafer 62 is determined by the size of the opening of the blasting nozzle 61 and by the rate at which the gaseous component of the coolant mixture, i.e., nitrogen gas is supplied thereto. As the supply of water vapor from the vaporizing chamber 50 to the freezing chamber 55 is determined by the pressure differential between these two chambers, an increase in the blasting pressure from the blasting nozzle 61 requires a corresponding increase in the internal pressure of the vaporizing chamber 50. The internal pressure of the vaporizing chamber 50 is equal to the vapor pressure of the water 51 in the vaporizing chamber 50. When the flow control valve 56 is closed, the vapor pressure of the water vapor generated in the vaporizing chamber 50 is about 13 kg per square cm at 190° C. Therefore, the pressure at which the ice particles are blasted from the freezing chamber 55, i.e., the pressure in the freezing chamber 55, can be easily maintained at a level of 5–8 kg per square cm.

In this embodiment, water 51 is used as a liquid to be formed into frozen particles, but other liquids may also be employed. However, if the liquid has a low vapor pressure, and if the opening of the flow control valve 56 or the inner diameter of the discharge end of the reducer 57 is large, the pressure within the vaporizing chamber 50 will significantly decrease. As a result the blasting pressure will fall to an unacceptably low level. The vapor pressure within the freezing chamber 55 can of course be increased by decreasing the opening of the flow control valve 56 or the minimum internal diameter of the reducer 57. However, the amount of vapor supplied to the freezing chamber 55 will decrease and an adequate amount of frozen particles will not be formed, so that in this case as well, the blasting pressure of the blasting nozzle 61 will be inadequate.

Therefore, when the liquid to be frozen is one with a low vapor pressure, it is advisable to employ a plurality of vaporizing chambers 50 which are connected to a single freezing chamber 55 in parallel through corresponding flow control valves 56 and reducers 57. With such an arrangement, the openings of the flow control valves 56 and the minimum internal diameters of the reducers 57 can be chosen to maintain an adequate pressure in each of the vaporizing chambers 50. Even though the flow rate of vapor from each vaporizing chamber 50 into the freezing chamber 55 will be small, the total flow rate from all the vaporizing chambers 50 will be sufficient to form a suitable quantity of frozen particles and maintain a suitable blasting pressure.

Figure 10:
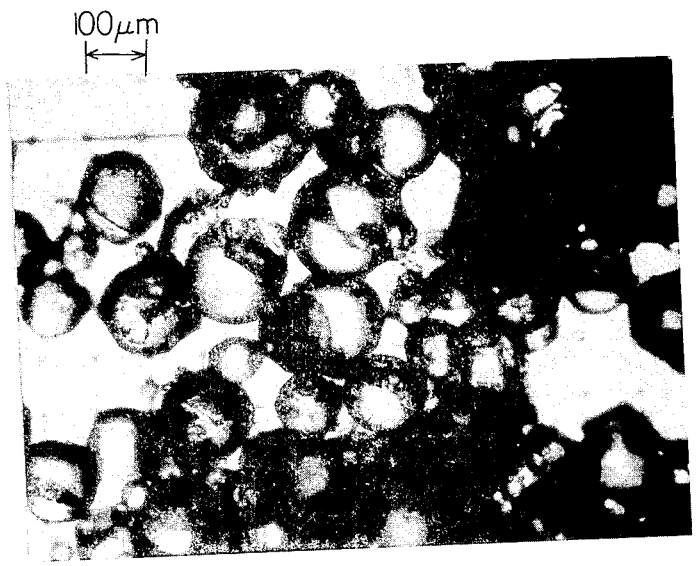
FIG. 10 is a photomicrograph of ice particles which were formed by a device of the type illustrated in FIG. 2.
Figure 11:
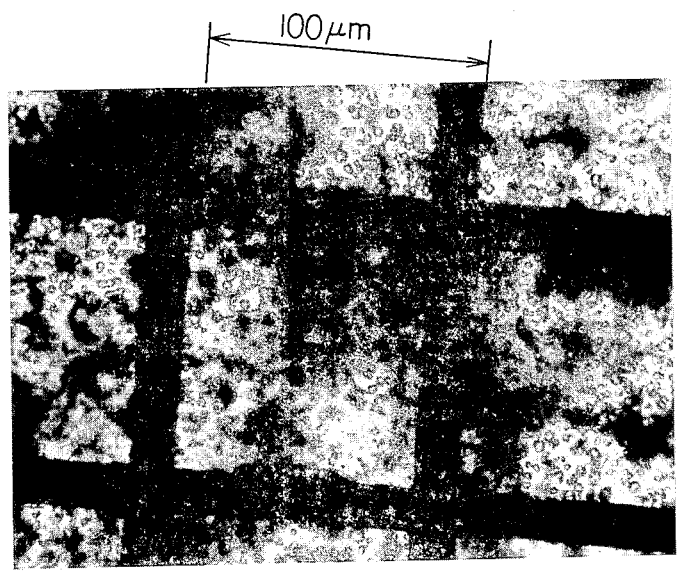
FIG. 11 is a photomicrograph of ice particles which were formed by the embodiment of FIG. 8.

When water is used as a liquid to be frozen and the temperature within the freezing chamber 55 is set at −100° C., using the embodiment of FIG. 8, ultrafine ice particles having a uniform particles diameter of approximately 1–2 microns can be obtained. FIG. 10 is a photomicrograph of ice particles formed using an apparatus like the embodiment of FIG. 2 in which a mist is sprayed onto liquid nitrogen, FIG. 11 is a photomicrograph of ice particles formed using the embodiment of FIG. 8. The ice particles of FIG. 10 have an average particle diameter on the order of 100 microns, and the particles are highly irregular in size. In contrast, the ice particles of FIG. 11 are much more uniform and have a far smaller particle diameter.

Therefore, using the present embodiment, it is possible to remove contaminant particles having a particle diameter on the submicron level from the surface of a semiconductor wafer, or to process delicate parts requiring precision working.

Furthermore, as the coolant mixture which is used to freeze the water vapor acts as a carrier for the ice particles when they are blasted from the blasting nozzle 61, there is only a small loss of coolant. Also, as the ice particles and the carrier gas are together supplied to the blasting nozzle 61, the structure of the apparatus is greatly simplified and it can be made compact.

Although in the present embodiment water 51 is used as a fluid to be frozen, it is also possible to employ ultrapure water which contains carbon dioxide gas and has a specific resistance of at most 1 megohm-cm with the same benefits as in the previous embodiments.

Although this embodiment of the present invention is in the form of a cleaning device for semiconductor wafers, the frozen particles which are formed by the freezing chamber 55 can be used for other purposes as well, such as gettering.

What is claimed is:

1. An apparatus for producing and propelling frozen particles against a surface comprising:
    a freezing chamber for containing a first gas and a first liquid at a temperature below the freezing point of a second liquid for freezing a mist of the second liquid to form frozen particles;
    a diffuser disposed in said chamber for injecting a second gas into the first liquid to produce waves in the first liquid;
    a reservoir for storing the second liquid;
    an atomizer in communication with said reservoir and said chamber for converting the second liquid from the reservoir into a mist in the gas in said chamber;
    a nozzle for directing the frozen particles formed from the mist in the freezing chamber against a surface; and
    means for propelling the frozen particles through and out of said nozzle.

2. The apparatus of claim 1 including a liquefied gas reservoir for storing a liquefied gas as the first liquid and means for supplying the liquefied gas from said liquefied gas reservoir to said chamber.

3. The apparatus of claim 2 including a heat exchanger in communication with said liquefied gas reservoir and said diffuser for converting the liquefied gas into the second gas and for supplying the second gas to said diffuser.

4. The apparatus of claim 3 wherein said means for propelling includes means interconnecting said heat exchanger with said nozzle for supplying the second gas to said nozzle for propelling the frozen particles through and out of the nozzle.

5. The apparatus of claim 3 wherein said heat exchanger is in communication with said atomizer for supplying the second gas to said atomizer for propelling the second liquid from the reservoir into said chamber.

6. The apparatus of claim 2 wherein said liquefied gas reservoir is a liquid nitrogen reservoir for storing liquid nitrogen.

7. The apparatus of claim 1 wherein said frozen particles have a diameter on the order of 20 microns.

8. The apparatus of claim 1 wherein said nozzle is disposed at an angle of 30° to 80° relative to a surface being cleaned.

9. The apparatus of claim 1 wherein the second liquid is water and the frozen particles are ice particles.

10. The apparatus of claim 1 including a storage hopper for storing the frozen particles, and means for conveying frozen particles from the first liquid to said storage hopper.

11. The apparatus of claim 10 wherein said means for conveying comprises a screw feeder.

12. A processing apparatus as claimed in claim 9 wherein said heating means comprises means for heating the wafer on a side opposite the frozen particles to a prescribed temperature.

* * * * *

UNITED STATES PATENT AND TRADEMARK OFFICE
CERTIFICATE OF CORRECTION

PATENT NO. : 4,932,168

DATED : June 12, 1990

INVENTOR(S) : Tada et al.

It is certified that error appears in the above-identified patent and that said Letters Patent is hereby corrected as shown below:

On the title page:
    In item [73], the first assignee should be:
--Taiyo Sanso Co., Ltd.--.

Signed and Sealed this

Thirtieth Day of June, 1992

*Attest:*

DOUGLAS B. COMER

*Attesting Officer*     *Acting Commissioner of Patents and Trademarks*